United States Patent
Yamaguchi et al.

[11] Patent Number: 5,844,776
[45] Date of Patent: Dec. 1, 1998

[54] STATIC MEMORY DEVICE HAVING COMPATIBILITY WITH A DISK DRIVE INSTALLED IN AN ELECTRONIC APPARATUS

[75] Inventors: Syuji Yamaguchi; Keiichiro Shiraki, both of Kawasaki, Japan

[73] Assignee: Fujitsu Limited, Kawasaki, Japan

[21] Appl. No.: 723,224

[22] Filed: Sep. 27, 1996

[30] Foreign Application Priority Data

Sep. 29, 1995 [JP] Japan .................................... 7-253032

[51] Int. Cl.⁶ ................................ G06F 1/16; H05K 7/02
[52] U.S. Cl. ......................... 361/684; 361/685; 361/731
[58] Field of Search .................................... 361/684–686, 361/731, 752, 790, 804; 364/708.1; 238/375, 379, 380, 381; 902/22; G06F 1/16

[56] References Cited

U.S. PATENT DOCUMENTS

| | | | |
|---|---|---|---|
| 4,639,863 | 1/1987 | Harrison et al. | 364/200 |
| 5,008,777 | 4/1991 | Burns | 361/804 |
| 5,299,089 | 3/1994 | Lwee | 361/685 |
| 5,398,157 | 3/1995 | Paul | 361/684 |
| 5,430,617 | 7/1995 | Hsu | 361/790 |
| 5,479,320 | 12/1995 | Estes et al. | 361/804 |
| 5,495,586 | 2/1996 | Adachi et al. | 361/685 |
| 5,507,650 | 4/1996 | Larabell | 361/685 |

FOREIGN PATENT DOCUMENTS 4-155415  5/1992  Japan .................................. G06F 1/16

*Primary Examiner*—Lynn D. Feild
*Attorney, Agent, or Firm*—Staas & Halsey

[57] ABSTRACT

A static memory device has compatibility with a disk drive installed in an electronic apparatus as an external storage unit. The static memory device has a first memory board arranged on the same base portion as the one on which the disk drive can be installed, the first memory board having the same projected area as the disk drive. On the first memory board is arranged a storage unit which is accessible at high speed, such as a semiconductor memory. When the storage capacity of the first memory board only is not enough, an extension memory board can be mounted on the first memory board. When the storage capacity is not sufficient even by mounting the extension memory board on the first memory board, a second memory board can be mounted on the extension memory board. Extension memory boards can also be mounted on the second memory board. Even in this state, the shape is the same as that of the disk drive. Therefore, the user is allowed to select either the disk drive or the static memory device and to mount it in the electronic apparatus as an external storage unit.

15 Claims, 14 Drawing Sheets

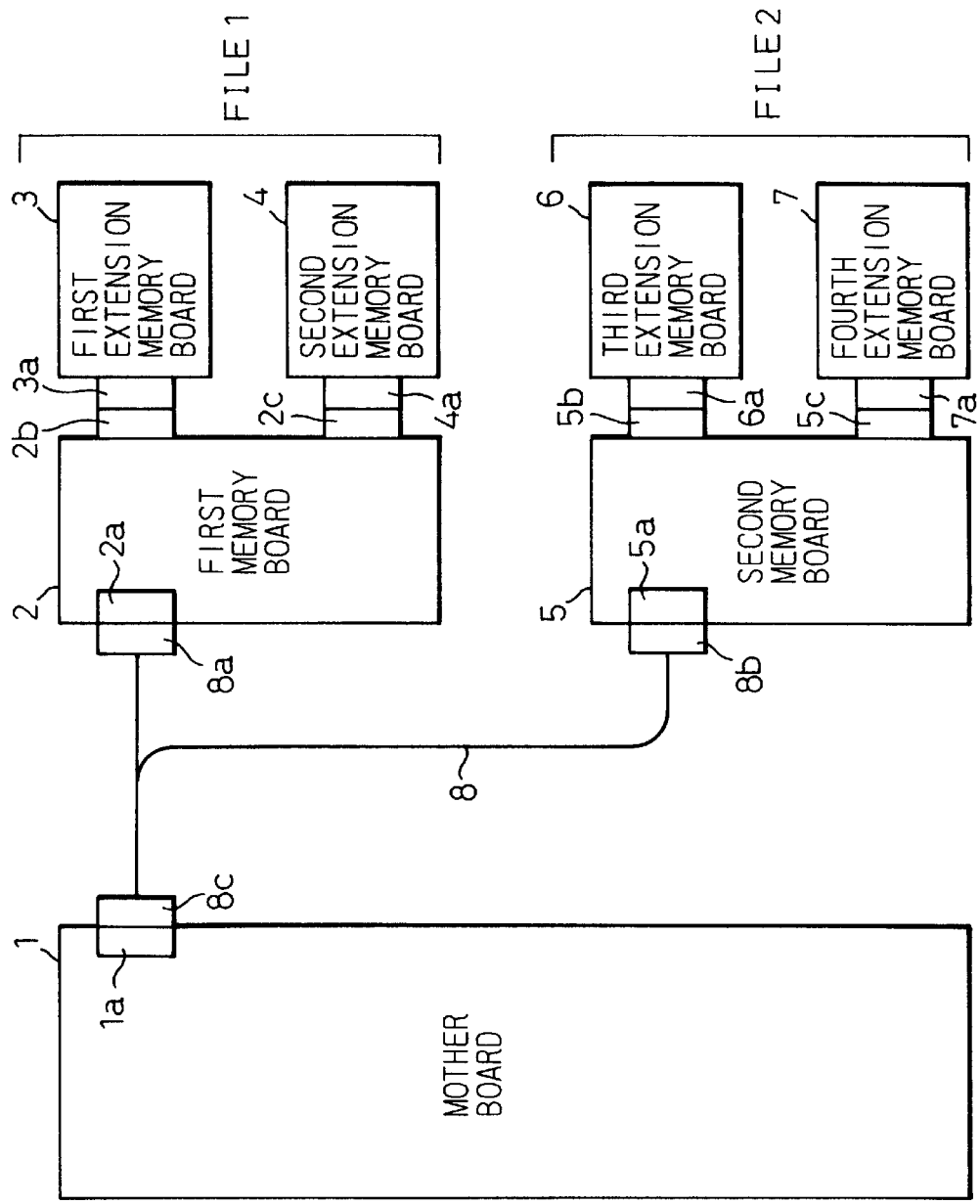

STATIC MEMORY DEVICE HAVING COMPATIBILITY WITH A DISK DRIVE INSTALLED IN AN ELECTRONIC APPARATUS

BACKGROUND OF THE INVENTION

1. Field of the Invention

The present invention relates to a static memory device having compatibility with a disk drive installed in an electronic apparatus.

2. Description of the Related Art

Modern electronic apparatuses containing computers usually use an internal storage unit as a memory device for processing data. It is desired that the internal storage unit operates at high speed and has a large capacity.

Here, a POS (point-of-sale) terminal equipment used in a POS system will be described as an electronic apparatus. Such a POS terminal equipment is used for exactly calculating the cost of goods purchased by customers in mass-sales stores which handle a wide variety, and large quantities, of goods, such as drug stores and supermarkets. In recent years, the kinds of goods handled by mass-sales stores are on the increase reflecting recent diverse life styles.

The POS terminal equipment in the POS system stores, in the storage unit thereof, the data related to goods handled in the store. As the kinds of goods handled in the store increase, it becomes necessary to increase the storage capacity of the storage unit for storing the data of goods.

On the other hand, it seldom happens that customers visit the store evenly during the open hours of the store but rather tend to visit in a concentrated manner during certain hours. Therefore, it has been desired to shorten, as much as possible, the time spent on each customer, i.e., to shorten, as much as possible, the time required for calculating the cost of the goods purchased by the customer at the check-out counter.

Calculation of the cost of goods purchased by the customer at the check-out counter is executed by retrieving a goods data file in the POS terminal equipment or by retrieving a goods data file in a host equipment to which the POS terminal equipment is connected, whereby data such as kinds and prices of goods are read out, and exact calculation is effected based on such data. In order to shorten the calculation time, the access time for the goods file must be shortened. That is, the POS terminal equipment must employ a storage unit that is accessible at high speed.

In the case of such a POS terminal equipment, a high-speed and large-capacity disk-like storage medium has heretofore been used as the internal storage unit. The disk-like storage medium may be a floppy disk drive, a hard disk drive or an optical disk drive. Among them, however, the hard disk drive is most generally used. Therefore, the following description deals with this hard disk drive.

In the hard disk drive, the data stored in the disk are read out by moving the head involving a problem in that the access time is delayed in retrieving the data. Moreover, the hard disk has a mechanism for driving the head using an access motor, accompanied by the probability of mechanical failure.

As the kinds of goods increase and as it becomes necessary to deal with the customers at an increased rate as described above, therefore, it becomes necessary to improve the reliability of holding the data.

As the internal storage unit of the POS terminal equipment, therefore, it has been desired to use a static memory device that is accessible at high speeds, such as a variety of semiconductor memories (single-in-line memory module, memory card, etc.) rather than to use the hard disk drive.

Concerning the reliability of holding data, furthermore, the hard disk drive is inferior to the semiconductor memories. To accomplish high-speed access and to enhance the reliability of holding data, therefore, it is desired to use a semiconductor memory.

To install the semiconductor memory in the POS terminal equipment, the semiconductor memory must be installed in addition to the conventional hard disk drive or must be installed to substitute for the hard disk drive.

When the semiconductor memory is to be installed in the POS terminal equipment in addition to the hard disk drive, space must be provided in the POS terminal equipment to install the semiconductor memory and a mechanism must be newly provided for the semiconductor memory. In recent years, however, it has been urged to realize the POS terminal equipment in a small size to save space. At present, therefore, there is no room to provide space for installing the semiconductor memory.

It has therefore been contrived to provide the POS terminal equipment with space for installing either the hard disk drive or the semiconductor memory and with a mounting mechanism therefor. Since the hard disk drive and the semiconductor memory have different shapes, however, it becomes necessary to provide a mounting mechanism that is adapted thereto.

However, not a few users who use the POS terminal equipment in stores may not deal with many kinds of goods and may not require a large-capacity internal storage unit such as semiconductor memory. For such users of the POS terminal equipment, the mechanism for mounting the semiconductor memory is quite useless.

Besides, a manufacturer of POS terminal equipment will find it a burden to separately manufacture the POS terminal equipment which mounts a hard disk drive only for the users who do not need a large-capacity internal storage unit such as semiconductor memory.

SUMMARY OF THE INVENTION

The object of the present invention therefore is to provide a static memory device having compatibility with a disk drive installed in an electronic apparatus such as POS terminal equipment, in order to lower the cost of production of the electronic apparatus by fabricating, in common, the mechanism for mounting the disk drive and for mounting the semiconductor memory.

A static memory device mounted on a base portion according to a first aspect of the present invention is installed in an electronic apparatus that executes various processings using a control unit equipped with a microcomputer and has compatibility with a disk drive mounted on the same base portion that is connected, via a cable, to the control unit and works as an internal storage unit for the control unit, and comprises a memory board mounted on the base portion and has a projected area smaller than the projected area of the disk drive, and a connector which is mounted on the memory board and is connected to the other end of the cable that is connected to the disk drive.

A static memory device according to a second aspect of the present invention is the static memory device of the first aspect which further comprises a connector for a memory extension mounted on the memory board, a spacer that can be mounted on the memory board, and at least a piece of extension memory board which is connected to the connector for memory extension, held by the spacer maintaining a predetermined gap from the memory board, and has a projected area smaller than the projected area of the memory board.

A static memory device according to a third aspect of the present invention is the static memory device of the second aspect, which further comprises a joint mounted on the extension memory board, a second memory board which is installed over the extension memory board via the joint and has a projected area smaller than the projected area of the memory board, and a connector which is mounted on the second memory board and is connected to the other end of the cable that is connected to the disk drive.

A static memory device according to a fourth aspect of the present invention is the static memory device of the third aspect, which further comprises a connector memory extension mounted on the second memory board, a spacer that can be mounted on the second memory board, and at least a piece of second extension memory board which is connected to the connector for memory extension, held by the spacer maintaining a predetermined gap from the memory board, and has a projected area smaller than the projected area of the memory board.

A static memory device according to a fifth aspect of the present invention is the static memory device of the second aspect, which further comprises a joint mounted on a base portion for arranging a new memory board on the extension memory board, a second memory board which is disposed on the extension memory board via the joint and has a projected area smaller than the projected area of the memory board, and a connector which is mounted on the second memory board and is connected to the other end of the cable that is connected to the disk drive.

A static memory device according to a sixth aspect of the present invention is the static memory device of the fifth aspect, which further comprises a connector for memory extension mounted on the second memory board, a spacer that can be mounted on the second memory board, and at least a piece of second extension memory board which is connected to the connector for memory extension, held by the spacer maintaining a predetermined gap from the memory board, and has a projected area smaller than the projected area of the memory board.

In the static memory device of the second aspect, the spacer is made of an electrically conducting material, and a grounding pattern of the memory board is rendered to be electrically conductive through the spacer to a grounding pattern of the extension memory board.

In the static memory device of the third aspect, the joint is made of an electrically conducting material, and a grounding pattern of the second memory board is rendered to be electrically conductive through the joint to a grounding pattern of the extension memory board.

In the static memory device of the fourth aspect, the spacer is made of an electrically conducting material, and a grounding pattern of the second memory board is rendered to be electrically conductive through the spacer to a grounding pattern of the second extension memory board.

In the static memory device of the fifth aspect, the joint is made of an electrically conducting material, and a grounding pattern of the second memory board is rendered to be electrically conductive through the joint to a grounding pattern of the base portion.

In the static memory device of the sixth aspect, the spacer is made of an electrically conducting material, and a grounding pattern of the second memory board is rendered to be electrically conductive through the spacer to a grounding pattern of the second extension memory board.

In the static memory devices of the fourth and sixth aspects, the height from the base portion to the second extension memory board is set to be equal to the height of the disk drive.

The electronic apparatuses to which the static memory device of the present invention can be adapted include POS terminal equipment and personal computers.

BRIEF DESCRIPTION OF THE DRAWINGS

The present invention will be more clearly understood from the description as set forth below with reference to the accompanying drawings, wherein:

FIG. 3 is a block diagram schematically illustrating a connection among a mother board in the control unit of FIG. 2A, memory boards connected thereto, and extension memory boards;

DESCRIPTION OF THE PREFERRED EMBODIMENTS

Figure 1:
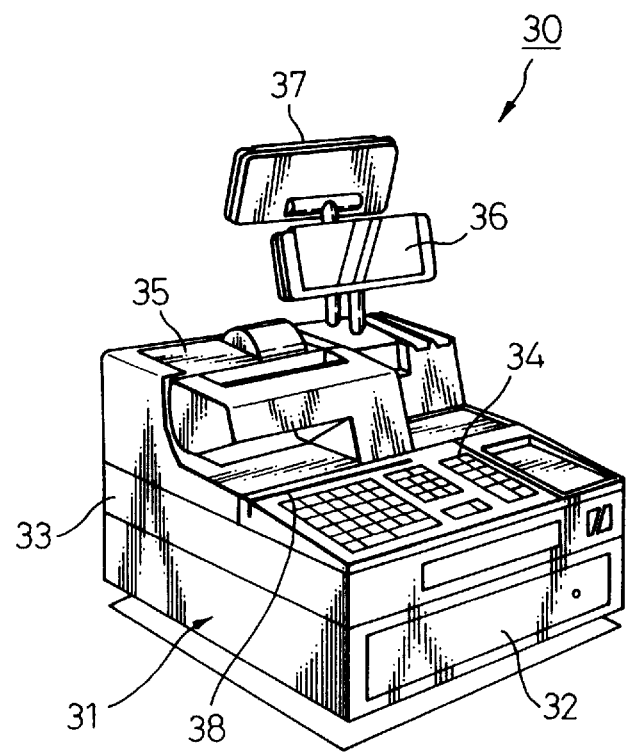
FIG. 1 is a perspective view of a POS terminal equipment which is an electronic apparatus to which the static memory device of the present invention can be adapted.

FIG. 1 illustrates a POS terminal equipment 30 containing a hard disk drive as an electronic apparatus in which a static memory device of the present invention can be used. In FIG. 1, reference numeral 31 denotes a body of POS terminal equipment 30, reference numeral 32 denotes a drawer for containing cash, 33 denotes a control unit, 34 denotes a keyboard for inputting article codes and prices of articles, 35 denotes a printer for printing a statement of account, 36 denotes an operator display for displaying the input prices to the operator, 37 denotes a customer display for displaying prices to a customer, and reference numeral 38 denotes a magnetic card reader for reading a credit card of a customer. In recent years, the article codes and prices have often been input to the POS terminal equipment 30 by reading bar codes and, hence, such a POS terminal equipment 30 has been equipped with a bar code reader. Here, however, the bar code reader does not have any direct relationship to the present invention, and is neither described nor diagrammed in this specification.

To the POS terminal equipment 30 shown in FIG. 1 are input article codes for discriminating articles and prices by using the keyboard 34 or a bar code reader that is not shown. An article data file provided in the POS terminal equipment 30 is retrieved by an article code that is input.

The article data file stores data (names and prices of articles) related to articles handled in the store as well as article codes corresponded thereto. The article data in the article data file are in many cases related to all articles in the store but are often related to only some of the articles in the store.

The POS terminal equipment 30 executes the calculation processing based upon article data read out from the article data file. The data processing such as calculation processing is executed by the control unit 33 of FIG. 1.

Figure 2A:
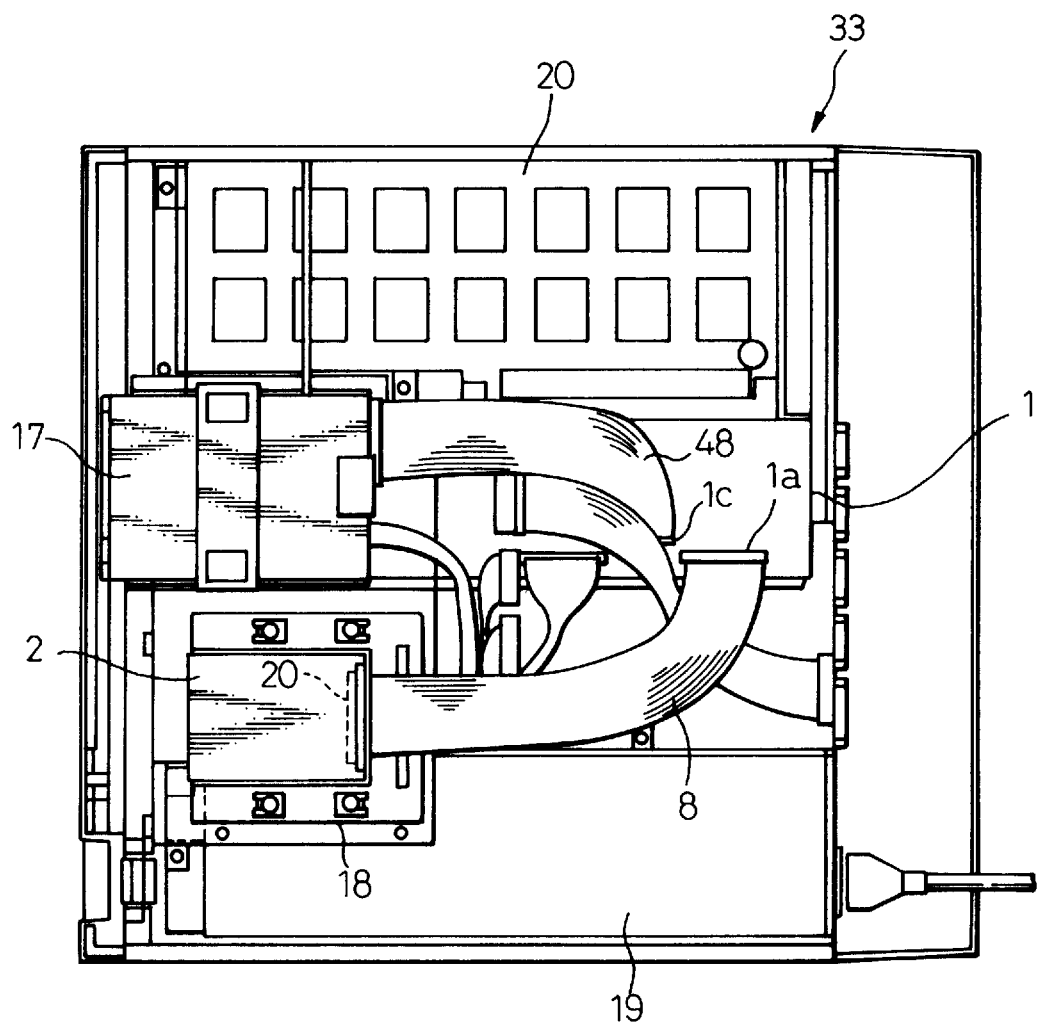
FIG. 2A is a plan view of a control unit in the POS terminal equipment of FIG. 1.

FIG. 2A is a plan view of the control unit 33 of the POS terminal equipment 30 of FIG. 1 of when the upper portion thereof is removed. The control unit 33 includes a mother board 1, a memory board 2, a floppy disk drive 17, a power source circuit 19, a control circuit, etc. The memory board 2 is mounted on the control unit 33 via a base portion 18, and is connected to the mother board 1 through a flat cable 8 that connects a connector 2a of the memory board 2 to a connector 1a of the mother board 1. The memory board 2 substitutes for a hard disk drive which was located in the same position.

The floppy disk drive 17 is connected to the connector 1c of the mother board 1 through a flat cable 48.

Figure 2B:
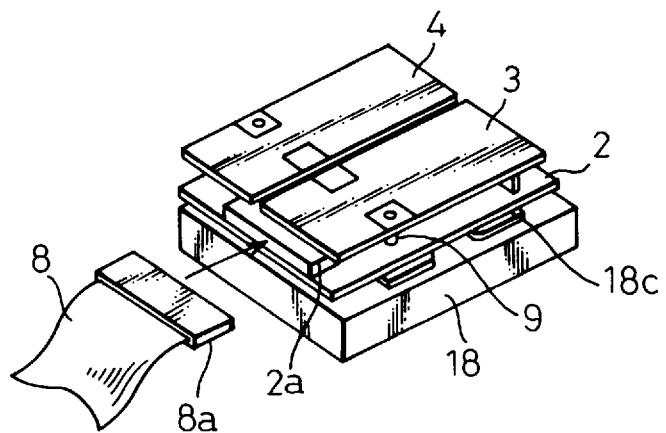
FIG. 2B is a perspective view illustrating a memory board and an extension memory board that can be mounted on the control unit of FIG. 2A.

FIG. 2B is a perspective view illustrating a state where extension memory boards 3 and 4 are mounted on the memory board 2 that is mounted on the control unit 33 of FIG. 2A. The memory board 2 is mounted on brackets 18c provided on the upper surface of the base portion 18. The extension memory boards 3 and 4 are mounted on the memory board 2 via cylindrical spacers 9. A connector 2a is mounted on the memory board 2. To the connector 2a is coupled a connector 8a that is provided at an end of the flat cable 8.

Figure 2C:
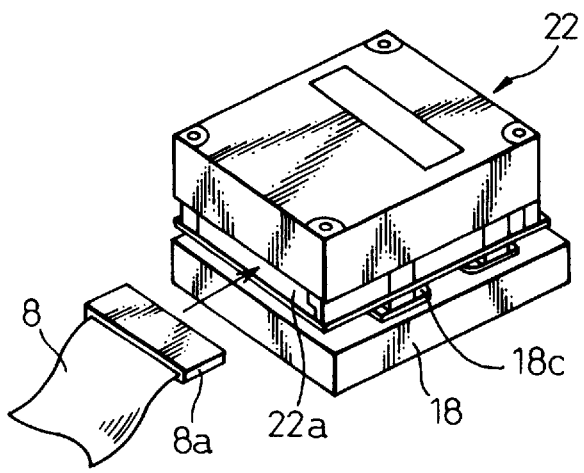
FIG. 2C is a perspective view illustrating the constitution of a hard disk drive that can be mounted on the control unit of FIG. 2A.

FIG. 2C illustrates the constitution of a hard disk drive 22 replaced by the memory board 2 illustrated in FIG. 2B in the control unit 33 of FIG. 2A. The hard disk drive 22 is mounted on a base portion 18 which is quite the same as the base portion 18 for mounting the memory board 2 via brackets 18c. The hard disk drive 22 has a connector 22a to which is coupled the connector 8a provided at an end of the flat cable 8. The hard disk drive 22 has a height larger than that of the memory board 2 on which the extension memory boards 3 and 4 are mounted.

FIG. 3 is a block diagram schematically illustrating the connections among the mother board 1 in the control unit 33 of FIG. 2A, memory boards 2 and 5 connected thereto, and extension memory boards 3, 4, 6 and 7 that can be connected to the memory boards 2 and 5. In FIG. 3, the mother board 1 performs a variety of control operations and is provided with a connector 1a. The memory board 2 is connected to the mother board 1 through the flat cable 8 that is connected at its connector 8c to the connector 1a. Hereinafter, the memory board 2 is referred to as a first memory board 2. Though not diagramed, the hard disk drive 22 explained with reference to FIG. 2C can also be connected to the connector 1a through the flat cable 8.

A nonvolatile semiconductor memory such as a flash memory is mounted on the first memory board 2. The flash memory is mounted on a printed board as a unitary structure. The flash memory is a rewritable EEPROM. The article data file is provided in the first memory board 2. The history data of transactions at the terminal can also be stored in the first memory board 2.

When the POS terminal equipment 30 needs only a small storage capacity, the first memory board 2 only is connected to the mother board 1 through the flat cable 8.

The first memory board 2 is equipped with connectors 2b and 2c for extension. Reference numerals 3 and 4 denote extension memory boards which are used for extending the memory of the first memory board 2. The extension memory boards 3 and 4 are equipped with connectors 3a and 4a, respectively. When the POS terminal equipment 30 needs a large storage capacity, extension memory boards 3 and 4 are connected to the connectors 2b and 2c of the first memory board 2 via connectors 3a and 4a. Like the first memory board 2, the extension memory boards 3 and 4 have a flash memory mounted on the printed board. Hereinafter, therefore, the extension memory boards 3 and 4 are referred to as first and second extension memory boards 3 and 4.

In FIG. 3, the first and second extension memory boards 3 and 4 are connected to the first memory board 2 to constitute a "FILE 1".

Reference numeral 5 denotes a memory board having a constitution which is basically the same as that of the first memory board 2. The memory board 5 can be used as a back-up memory for the first memory board 2. Hereinafter, therefore, the memory board 5 is referred to as a second memory board 5. The second memory board 5 is also provided with connectors 5b and 5c for extension. The second memory board 5 is used for extending the memory. That is, when the POS terminal equipment 30 needs have a very large storage capacity, the flat cable 8 of which the end is branched into two is connected to the connector 1a of the mother board 1. To the connector 8a at one end is connected the first memory board 2 to which are connected the first and second extension memory boards 3 and 4, and to the connector 8b at the other end is connected the second memory board 5.

Reference numerals 6 and 7 denote extension memory boards which are used for extending the memory of the second memory board 5. The extension memory boards 6 and 7 have connectors 6a and 7a, respectively. The extension memory boards 6 and 7 are constituted in the same manner as the first and second extension memory boards 3 and 4. Hereinafter, therefore, the extension memory boards 6 and 7 are referred to as third and fourth extension memory boards 6 and 7.

The third and fourth extension memory boards 6 and 7 are connected to the connectors 5b and 5c of the second memory board 5 through the connectors 6a and 7a. According to this embodiment as described above, a maximum of six pieces of memory boards can be connected to the mother board 1. In FIG. 3, the third and fourth extension memory boards 6 and 7 are connected to the second memory board 5 to constitute a "FILE 2".

Figure 4:
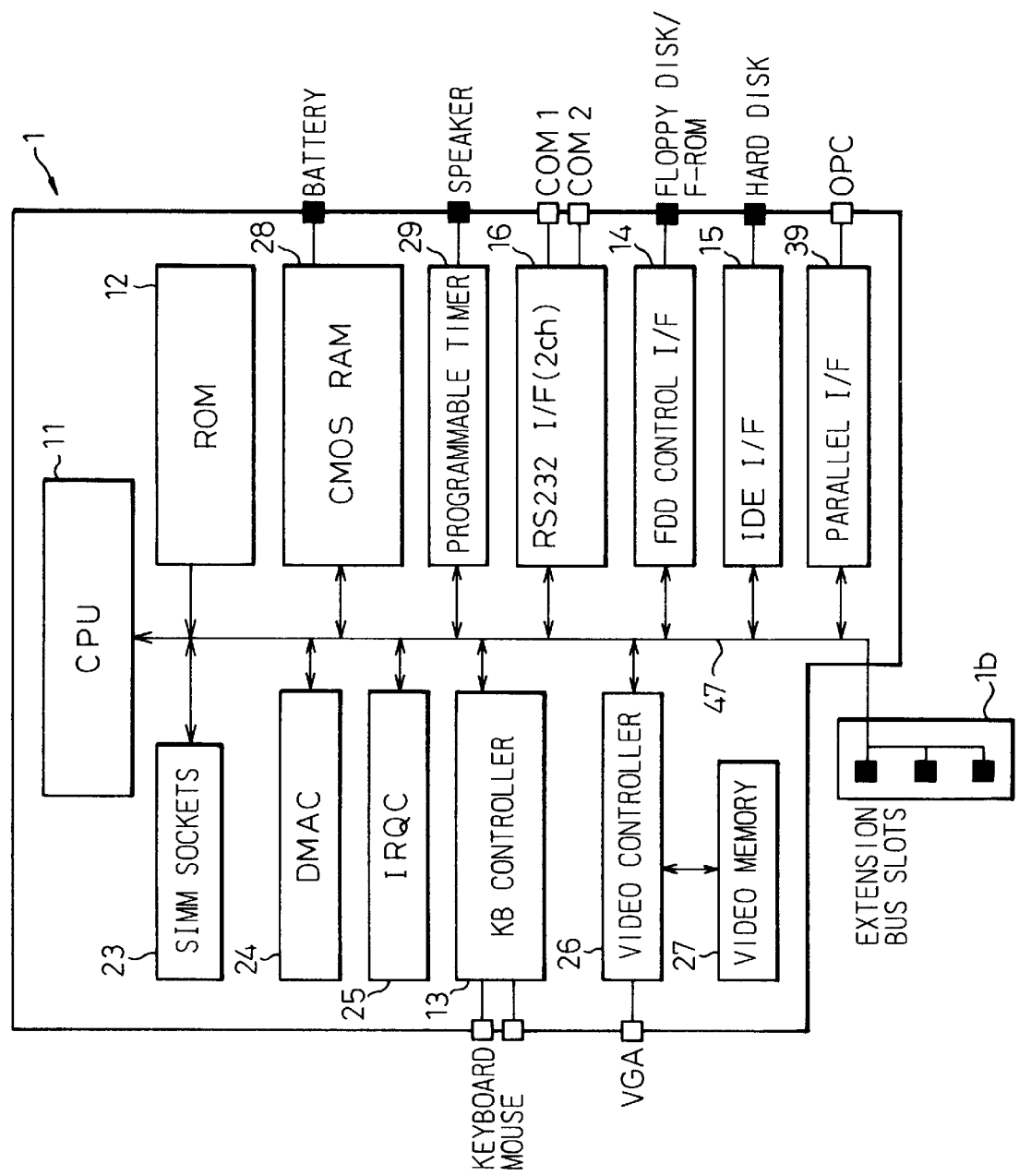
FIG. 4 is a block diagram illustrating the constitution of the mother board mounted on the control unit of FIG. 2A.

FIG. 4 is a diagram illustrating the constitution of the mother board 1 on which are mounted extension bus slots 1b, a CPU 11 for controlling the operation of the POS terminal equipment 30, a ROM 12 in which is stored the operation program, a keyboard controller 13 to which is connected an input means such as keyboard or the like, an FDD control interface unit 14 to which a floppy disk is connected, an IDE interface unit 15 to which is connected a hard disk or a memory board, and an interface unit 16 such as RS232C or the like to which an internal unit is connected.

The mother board 1 further includes a socket 23 for single-inline-memory-module (SIMM), a direct access memory controller (DMAC) 24, an interference request controller (IRQC) 25, a video controller 26, a video memory 27, and a CMOS-RAM 28 for a timer and a programmable timer 29, which are connected to one another through a bus 47.

The first and the second memory boards 2 and 5 are connected to the IDE interface unit 15 of the mother board 1 as described earlier.

Figure 5:
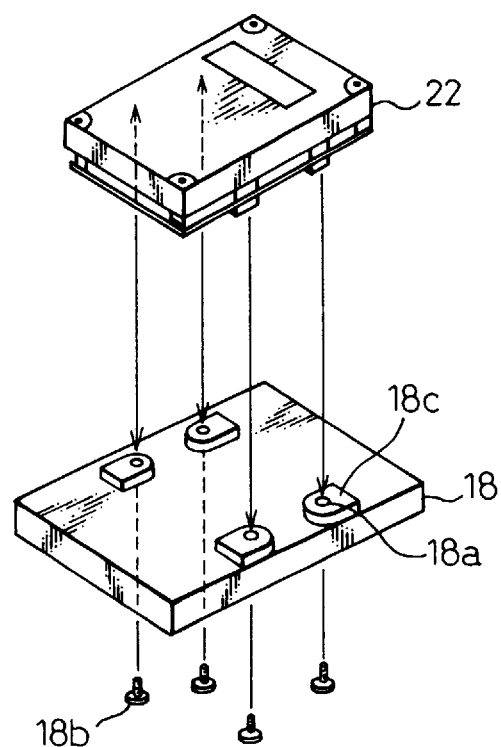
FIG. 5 is a perspective view of an assembly in which the hard disk drive shown in FIG. 2C is mounted on the base portion.

FIG. 5 is a perspective view of an assembly in which the hard disk drive 22 shown in FIG. 2C is mounted on the base portion 18.

The base portion 18 is entirely or at least partly constituted by a metal. The base portion 18 is provided with a plurality (four in the case of FIG. 5) of brackets 18c on which will be mounted the hard disk 22 or the first memory board 2. Each bracket 18c has a threaded hole 18a formed therein, so that a screw 18b can be inserted therein. As shown in FIG. 5, the hard disk drive 22 is placed on the brackets 18c on the base portion 18, is fastened to the brackets 18c by screws 18b, and is thus secured onto the base portion 18.

Figure 6:
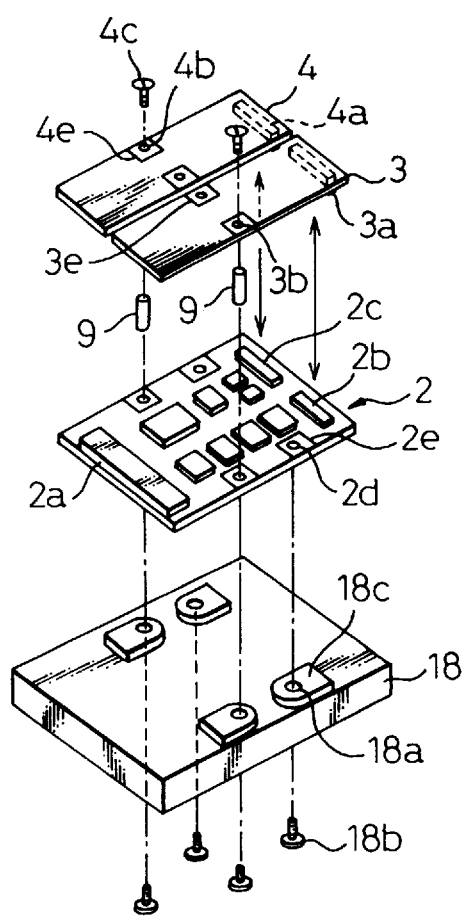
FIG. 6 is a perspective view of an assembly in which the memory board and the extension memory board shown in FIG. 2B are mounted on the base portion.

FIG. 6 is a perspective view of an assembly in which the first memory board 2 shown in FIG. 2B, and the first and second extension memory boards 3 and 4, are mounted on the base portion 18.

A connector 2a that connects to the mother board 1 is provided at an end of the first memory board 2. At the other end of the first memory board 2 are provided the connectors 2b and 2c that connect to the first and second extension memory boards 3 and 4. The first memory board 2 comprises a printed board on which is mounted a semiconductor memory such as a flash memory, etc.

The first memory board 2 is provided with holes 2d at positions corresponding to the threaded holes 18a of the brackets 18c of the base portion 18. In FIG. 6, the holes 2d are formed at a total of four places. The holes 2d correspond to the ground (GND) of the printed board. As shown, the holes 2d are surrounded by part of the pattern 2e of the printed board.

Connectors 3a and 4a connected to the connectors 2b, 2c of the first memory board 2 are provided at the ends of the first and second extension memory boards 3 and 4. Like the first memory board 2, the first and second extension memory boards 3 and 4 comprise printed boards on which are mounted semiconductor memories such as flash memories.

Holes 3b and 4b are also formed in the first and second extension memory boards 3 and 4. In the case of FIG. 6, the first and the second extension memory boards 3 and 4 are the same. Therefore, the holes 3b and 4b are formed on each side of the boards so that they can be mounted on either the right side or the left side. The holes 3b and 4b are brought into agreement with the positions of the holes 2d of the first memory board 2 in a state where the connectors 3a and 4a of the first and second extension memory boards 3 and 4 are connected to the connectors 2b and 2c, and, hence, correspond to the grounds of the printed board like the holes 2d. The holes 3b and 4b are also surrounded by the patterns 3e and 4e of the printed board.

To mount the thus constituted first memory board 2, and the first and second extension memory boards 3 and 4 on the POS terminal equipment 30, the connectors 2b and 2c of the first memory board 2 are connected to the connectors 3a and 4a of the first and second extension memory boards 3 and 4. Then, spacers 9 are fitted between the holes 2d and 3b and between the holes 2d and 4b. The spacers 9 are cylindrical members and are threaded at their upper and lower surfaces. The first and second extension memory boards 3, 4 and the spacers 9 are fastened together using screws.

Figure 7:
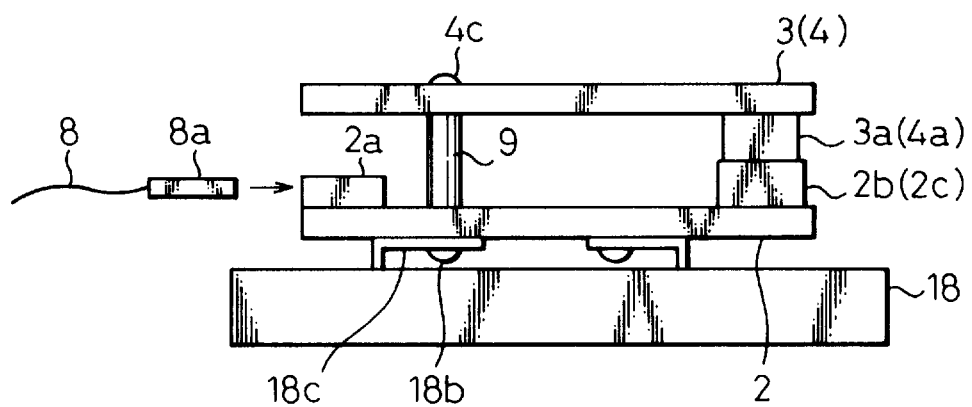
FIG. 7 is a side view of the memory board in a state where the memory board shown in FIG. 6 is assembled.

FIG. 7 illustrates a state where the first memory board 2 shown in FIG. 6 as well as the first and second extension memory boards 3 and 4 are assembled. The first memory board 2 and the first and second extension memory boards 3, 4 are connected together using connectors 2b, 2c, 3a and 4a. The upper surfaces of the spacers 9 and the first and second extension memory boards 3, 4 are fastened together using screws 4c.

Then, in order to mount the first memory board 2 on the base portion 18, the brackets 18c of the base portion 18 and the spacers 9 are fastened by screws 18b from the back surface of the base portion 18. Thus, the first memory board 2 is connected, the first memory board 2 being obtained by mounting the first and second extension memory boards 3 and 4 on the base portion 18. Thereafter, the connector 8a of the flat cable 8 is connected to the connector 2a in order to connect the first memory board 2 to the mother board 1.

The spacer is made of an electrically conducting material. As described above, furthermore, the holes 2d, 3b and 4b correspond to the ground of the printed board, and a grounding pattern is formed on both surfaces of the first memory board 2. Therefore, the grounding patterns of the first memory board 2 and of the first and second extension memory boards 3, 4 are maintained at ground level by the spacers 9.

Figure 8:
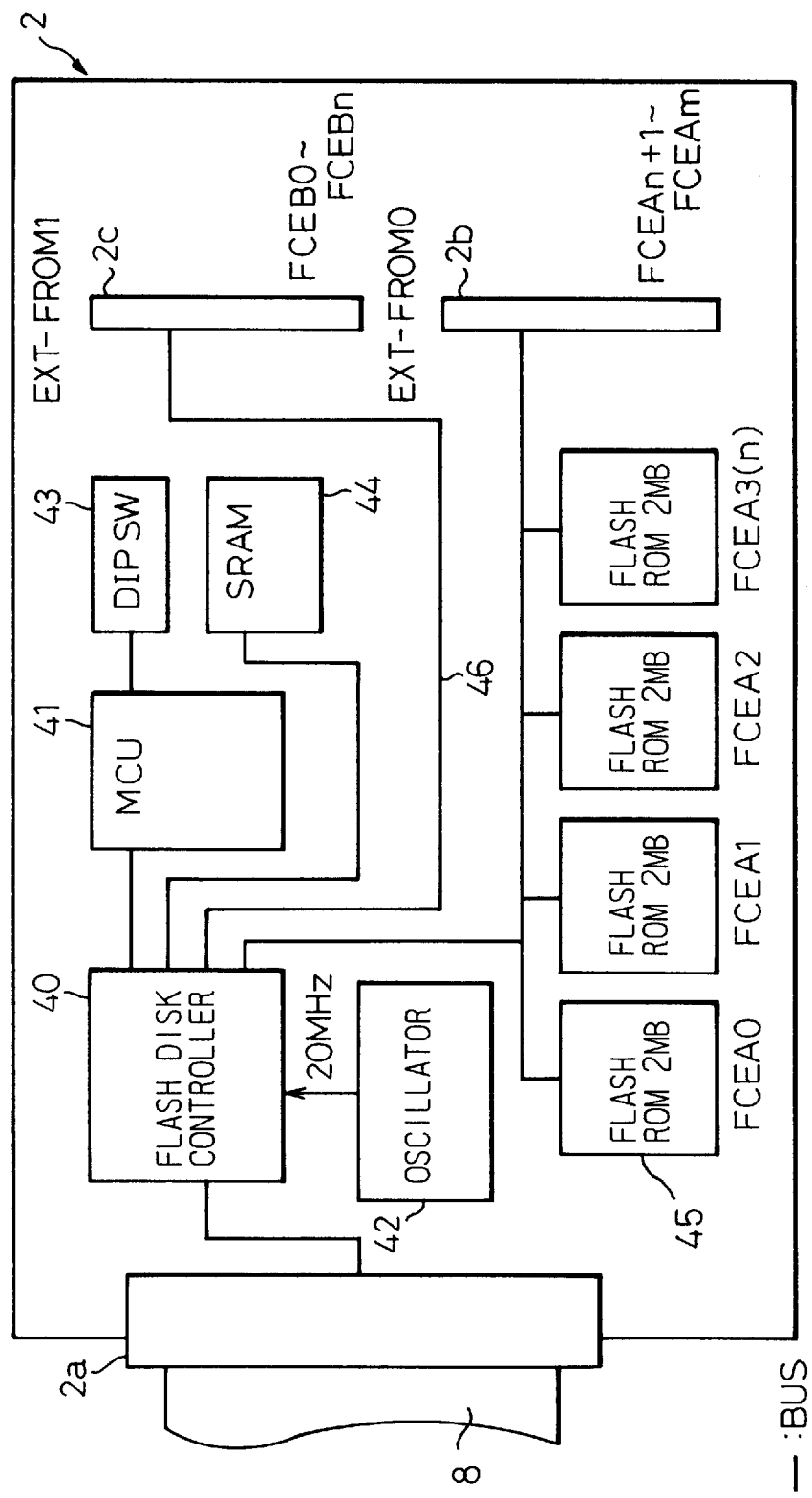
FIG. 8 is a block diagram illustrating the arrangement of components on the memory board of FIG. 6 according to an embodiment.

FIG. 8 is a block diagram illustrating the arrangement of parts on the first memory board 2 shown in FIG. 6 according to an embodiment.

As shown in FIG. 8, the first memory board 2 is provided with connectors 2a, 2b and 2c. As described already, the flat cable 8 is connected to the connector 2a, and the first and second extension memory boards 3 and 4 are connected to the connectors 2b and 2c.

On the first memory board 2 is mounted a flash ROM 45. According to this embodiment, the flash ROM 45 has a storage capacity of 2 MB. On the first memory board 2 of FIG. 8 are mounted a total of four flash ROMs each having a storage capacity of 2 MB. The parts on the first memory board 2 are connected together through a bus 46. Chip select signals FCEA0 to FCEA3 are assigned to the four flash ROMs 45. When there are n flash ROMs 45, the chip select signals to be assigned will be FCEA0 to FCEAn.

On the first memory board 2 are mounted a flash disk controller 40, an MCU 41, an oscillator 42, a DIP switch 43 for setting how many flash ROMs 45 are mounted, and an SRAM 44.

The flash disk controller 40 selects a flash ROM 45 that is to be accessed based upon an access instruction given from the control unit 33 in the POS terminal equipment 30. The flash disk controller 40 outputs a chip select signal, and access is made to a flash ROM 45 depending upon the chip select signal. Furthermore, clocks of 20 MHz are fed to the flash disk controller 40 which, then, performs the operation based upon the clocks.

Figure 9:
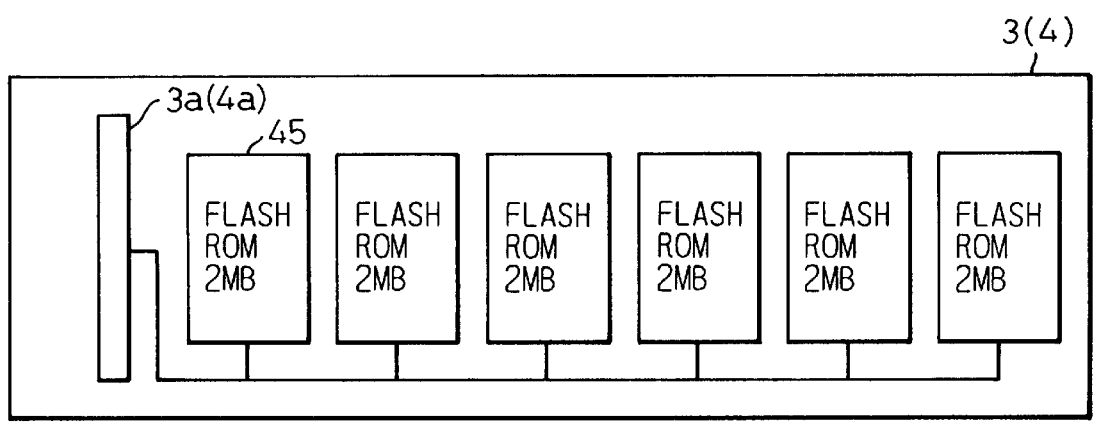
FIG. 9 is a block diagram illustrating the arrangement of components on the extension memory board of FIG. 6 according to an embodiment.

FIG. 9 is a block diagram illustrating the arrangement of parts on the first and second extension memory boards 3 and 4 shown in FIG. 6 according to an embodiment.

On the first and second extension memory boards 3 and 4 of the same structure are mounted the connectors 3a, 4a and one or more flash ROMs 45. In the case of the first and second extension memory boards 3 and 4 of FIG. 9, a total of six flash memories 45 having a storage capacity of 2 MB are mounted, and chip select signals are assigned to the respective flash memories 45 as in the case of the first memory board 2.

The chip select signals for the flash memories 45 on the first and second extension memory boards 3 and 4 change depending upon whether the first and second extension memory boards 3 and 4 are connected to the connector 2b or are connected to the connector 2c of the first memory board 2.

For example, when the first extension memory board 3 mounting flash memories 45 of a number of m-n is connected to the connector 2b, the chip select signals FCEAn+1 to FCEAm are supplied. These signals follow the chip select signals FCEA0 to FCEAn that are fed to the flash memories 45 mounted on the first memory board 2. The flash memories 45 on the first memory board 2 and the flash memories 45 on the first extension memory board 3 connected to the connector 2b, can be handled in the same manner as those mounted on the same memory board.

On the other hand, when the second extension memory board 4 mounting flash memories 45 of a number of m-n is connected to the connector 2c, the chip select signals FCEB0 to FCEBm-n are supplied.

Thus, exactly the same extension memory board can be used as the first and second extension memory boards 3 and 4 that are connected to the first memory board 2.

In FIG. 9, the chip select signals FCEB0 to FCEBm-n for the flash memories 45 on the second extension memory board 4 connected to the connector 2c are drawn being overlapped on the chip select signals FCEA0 to FCEAm for the flush memories 45 on the first memory board 2 or on the first extension memory board 3 connected to the connector 2b. However, the flash disk controller 40 recognizes the flash memories 45 on the side to which access is made, and never confuses the flash memories 45 of the side of the connector 2b with the flash memories 45 of the side of the connector 2c.

Figure 10A:
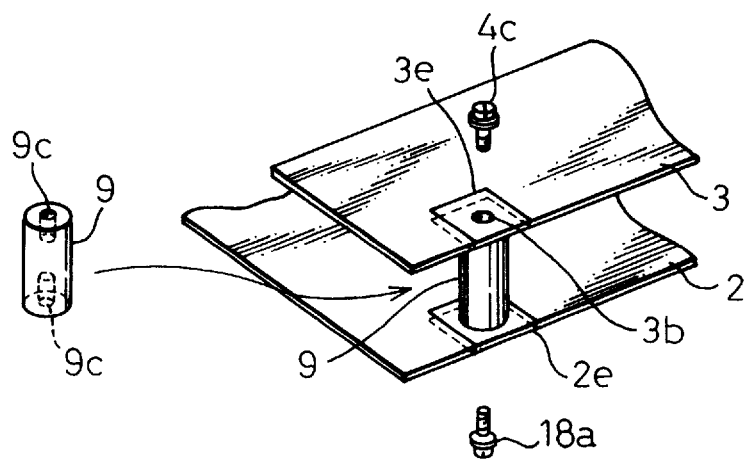
FIG. 10A is a perspective view illustrating, on an enlarged scale, an example of a portion where the memory board and a grounding pattern of the extension memory board are connected together using a spacer.

FIG. 10A is a diagram illustrating a state in which a metallic spacer 9 is mounted between the first memory board 2 and the first and second extension memory boards 3, 4. As shown, the grounding patterns 2e are formed on both surfaces of the first memory board 2 surrounding the hole 2d, and the grounding patterns 3e are formed on both surfaces of the first extension memory board 3 surrounding the hole 3b. The spacer 9 is made of a metal and has a cylindrical shape, and is provided with threaded holes 9c in the upper and lower surfaces thereof. The spacer 9 is mounted between the first memory board 2 and the first extension memory board 3 in such a manner that both ends thereof are in contact with the ground patterns 2e and 3e. The grounding patterns 2e and 3e on both surfaces are so formed as to hold the first memory board 2 and the first extension memory board 3 sandwiched therebetween, respectively, and their both surfaces are rendered to be electrically conductive to each other. In this state, the spacer and the first memory board 2 are fastened together using a screw 18a, and the spacer 9 and the first extension memory board 3 are fastened together using a screw 4c, so that the spacer 9, the first memory board 2 and the first extension memory board 3 are fastened together, and the two grounding patterns 2e and 3e are rendered to be electrically conductive to each through the spacer 9.

Figure 10B:
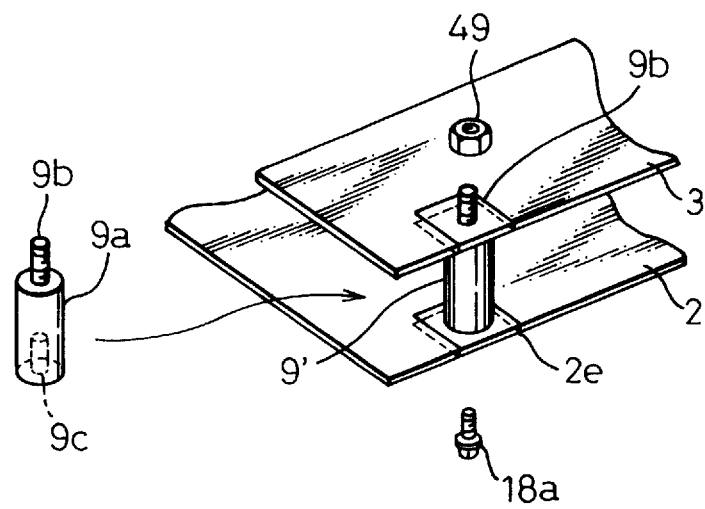
FIG. 10B is a perspective view illustrating, on an enlarged scale, another example of a portion where the memory board and a grounding pattern of the extension memory board are connected together using a spacer.

FIG. 10B illustrates a modified embodiment of FIG. 10A. A metallic spacer 9a having a threaded hole 9c formed in the lower surface thereof and a screw 9b protruded beyond the upper surface thereof, is mounted between the first memory board 2 and the first and second extension memory boards 3 and 4.

In this embodiment, the lower surface of the spacer 9a is fastened to the first memory board 2 by a screw 18a in the same manner as mentioned above, but the spacer 9a and the first extension memory board 3 are fastened together using a nut 49 making a difference from the embodiment of FIG. 10A. The first memory board 2 and the first extension memory board 3 are fastened together using spacers 9a, and the two grounding patterns 2e and 3e are rendered to be electrically conductive to each other through the spacers 9a in the same manner as described above.

Since the electrically conducting spacers 9, 9' are interposed between the first memory board 2 and the first extension memory board 3 as described above, the grounds of the upper and lower printed boards are connected together through a small impedance due to the spacers 9, 9'. With the upper and lower grounds being connected together through spacers 9, 9' as described above, it is possible to decrease electrostatic noise or the effects of external electromagnetic waves. Besides, the base portion 18 is made of a metal and is connected to the ground of the POS terminal equipment 30.

When the first memory board 2 and the first and second extension memory boards 3, 4 are connected together through connectors only, it is likely that the connectors may be disconnected by vibration of the apparatus. However, since the first memory boards 2 and the first and second extension memory boards 3, 4 have been secured together using screws via spacers 9, 9', the connectors are prevented from being disconnected.

It is further allowed to maintain a predetermined space between the first memory board 2 and the first and second extension memory boards 3, 4 due to the spacers 9, 9'.

The shape and size of the first memory board 2 and the first and second extension memory boards 3, 4 when combined together according to the present invention, are the same as that of the hard disk drive 22, when it is mounted on the base portion 18. With the outer shapes of the two being compatible with each other, it is possible to suitably select whether the hard disk drive 22 is mounted on the POS terminal equipment 30 or the memory board formed by a combination of the first memory board 2 and the first and second extension memory boards 3, 4 is mounted on the POS terminal equipment 30. This eliminates the need to provide the POS terminal equipment 30 with base portions adapted to both of these memory units. Moreover, space in the POS terminal equipment 30 is exactly the same as that of the prior apparatus which contained the hard disk drive 22 only. Therefore, the POS terminal equipment 30 does not become bulky.

If the first memory board 2 only is enough for obtaining the required storage capacity, there is no need to mount the first and second extension memory boards 3 and 4. Even when it is required to extend the memory, either one of the first or the second extension memory board 3 or 4 may be provided as required.

In the POS terminal equipment 30, it may often become necessary to protect the data in the user region or to add an electronic journal function for recording the data of transactions. In such a case, the storage capacity of the first memory board 2 mounting the first and second extension memory boards 3 and 4, may not be sufficient. In such a case, memory boards may be added to the first and second extension memory boards 3 and 4.

The memory boards that can be further extended on the first and second extension memory boards 3 and 4 may include a second memory board 5 having the same constitution as the first memory board 2, and third and fourth extension memory boards 6 and 7 having the same constitution as the first and second extension memory boards 3 and 4. By using the memory boards of the same constitution, it is possible to maintain the same memory region in the upper and lower memory boards.

Figure 11A:
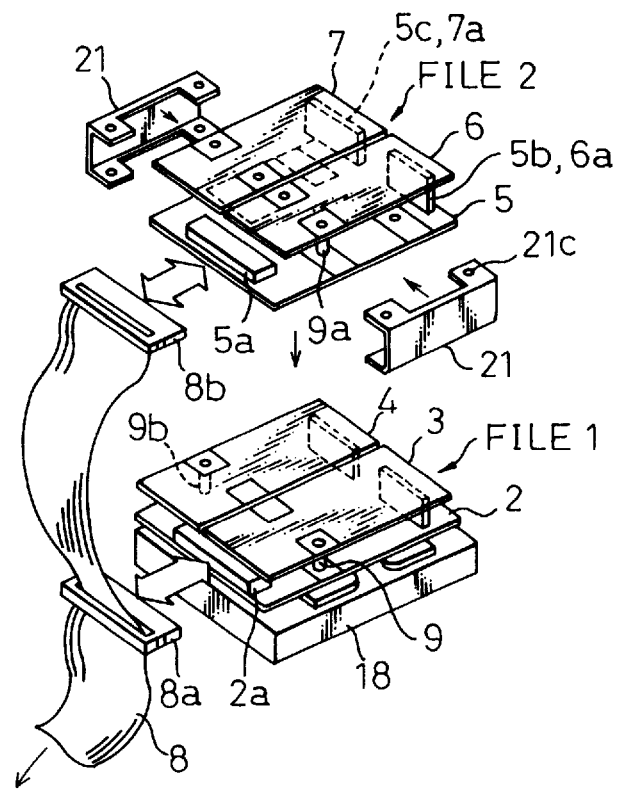
FIG. 11A is a perspective view of an assembly in which another extension memory board is mounted on the memory board and on the extension memory board shown in FIG. 2B according to an embodiment.
Figure 11B:
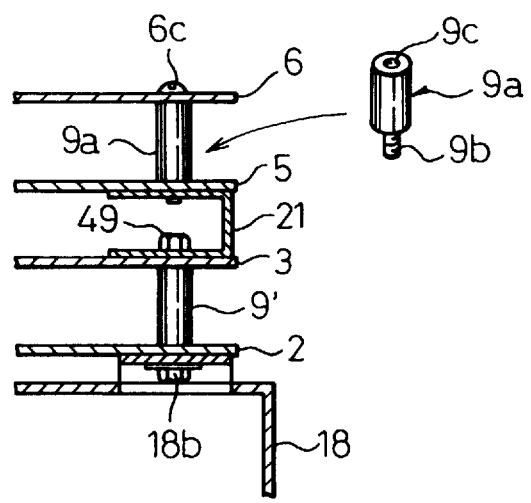
FIG. 11B is a sectional view illustrating, on an enlarged scale, a portion of the assembly of FIG. 11A.

FIG. 11A is a diagram illustrating a state where the second memory board 5 for extension as well as the third and fourth extension memory boards 6 and 7 are mounted on the first memory board 2 and on the first and second extension memory boards 3 and 4 that have already been mounted on the base portion 18. FIG. 11B illustrates a state where the second memory board 5 for extension as well as the third and fourth extension memory boards 6 and 7 are mounted on the first and second extension memory boards 3 and 4.

Here, the first memory board 2 and the first and second extension memory boards 3, 4 are diagrammed as "FILE 1", and the second memory board 5 and the third and fourth extension memory boards 6, 7 are diagrammed as "FILE 2".

The first memory board 2 and the first and second extension memory boards 3, 4 of the "FILE 1" and the second memory board 5 and the third and fourth extension memory boards 6, 7 of the "FILE 2" are connected in parallel. Accordingly, the "FILE 2" can be used as a back-up memory of the "FILE 1", if the same data is stored both in the "FILE 1" and "FILE 2".

The second memory board 5 is provided at its one end with a connector 5a that connects to the mother board 1 and is provided at its other end with connectors 5b and 5c that connect to the third and fourth extension memory boards 6 and 7. Similarly, the third and fourth extension memory boards 6 and 7 are provided at the ends on one side thereof with connectors 6a and 7a that connect to the connectors 5b and 5c.

When the second memory board 5 and the third and fourth extension memory boards 6, 7 are to be mounted on the first and second extension memory boards 3 and 4, the connectors 5b and 5c are connected to the connectors 6a and 7a, and the boards are fastened together using screws via spacers 9a as in the case of connecting the first memory board 2 and the first and second extension memory boards 3, 4 together. The grounds of the second memory board 5 and the third and fourth extension memory boards 6 and 7 are connected together through the spacers 9a.

Here, a first method of mounting the second memory board 5 and the third and fourth extension memory boards 6, 7 on the first and second extension memory boards 3 and 4, consists of inserting rectangular metal fittings 21 between the first and second extension memory boards 3, 4 and the second memory board 5, and fastening the first and second extension memory boards 3 and 4 and the second memory board 5 to the metal fitting 21 using screws. The metal fitting 21 is provided with four threaded holes 21c, and has an electrically conducting property since it is made of a metal.

Here, described below is a procedure for mounting the first memory board 2 and the second memory board 5 on the same base portion 18. When the second memory board 5 and the third and fourth extension memory boards 6, 7 are to be mounted on the first and second extension memory boards 3 and 4 by using the metal fitting 21 shown in FIG. 11A, the mounting operation can be easily accomplished if the first memory board 2 is connected to the first extension memory board 3 by using the spacers 9a explained with reference to FIG. 10B.

In this case, the nut 49 is removed from the screw 9b of the spacer 9a, the hole 21c of the metal fitting 21 is fitted to the screw 9b and the nut 49 is attached again, thereby to mount the metal fitting 21 on the first extension memory board 3. Then, the second memory board 5 is placed on the metal fitting 21 such that the holes are in agreement with the holes 21c of the metal fitting, and the metallic spacer 9a used in FIG. 10B, i.e., the metallic spacer 9a having a threaded hole 9c in the lower surface and having a screw 9b protruded beyond the upper surface thereof is fitted upside down and is fastened to the second memory board 5 and to the metal fitting 21 using a screw 9b.

In this state, the connectors of the second memory board 5 and the third extension memory board 6 are connected together and, finally, the third extension memory board 6 is fastened to the spacer 9a using a screw 6c. This state is shown in FIG. 11B. The connection can be accomplished in the same manner between the second extension memory board 4 and the second memory board 5, and between the second memory board 5 and the fourth extension memory board 7.

By using the rectangular metal fitting 21 as described above, the first memory board 2, the first and second extension memory boards 3, 4, the second memory board 5, and the third and fourth extension memory boards 6, 7 can be mounted on the same metal base portion 18. Due to the metal fitting 21, furthermore, a predetermined gap is maintained between the second memory board 5 and the first and second extension memory boards 3, 4.

Grounding patterns of the first memory board 2 and the first and second extension memory boards 3, 4 are connected together through the spacers 9. Furthermore, grounding patterns of the second memory board 5 and third and fourth extension memory boards 6, 7 are connected together through the spacers 9a. Moreover, grounding patterns of the first and second extension memory boards 3, 4 and the second memory board 5 are connected together through the metal fittings 21. Thus, the grounding patterns of the memory boards 2 to 7 are electrically connected together maintaining a small impedance, making it possible to decrease electrostatic noise or the effect of electromagnetic waves from the outside as in the case of FIG. 6.

The connector 2a of the first memory board 2 and the connector 5a of the second memory board 5 are connected to the mother board 1 through the flat cable 8. The flat cable 8 used here has connectors 8a and 8b at two places, i.e., at the front end and at a place remote from the front end by a predetermined distance. The connectors 8a and 8b exchange the same signals with the flat cable 8. The connector 8a is connected to the connector 2a, and the connector 8b is connected to the connector 5a, respectively.

According to the present invention in which the memory boards 2 to 7 are assembled as shown in FIG. 11B, the height is the same as, or is little different from, the height of the hard disk drive 22 mounted on the base portion 18. As a result, the POS terminal equipment 30 does not require a large space in the vertical direction for mounting the memory boards 2 to 7, and is realized in the same size as the conventional POS terminal equipment 30.

Figure 12:
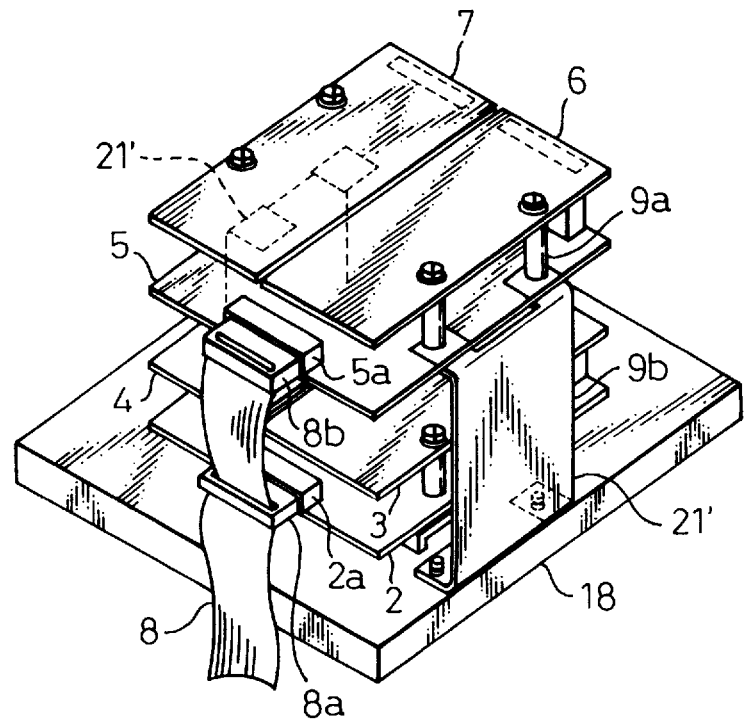
FIG. 12 is a perspective view of when another extension memory board is mounted on the memory board and on the extension memory board shown in FIG. 2B according to another embodiment.
Figure 13:
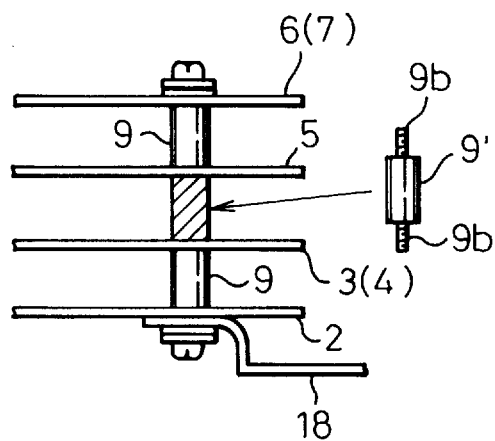
FIG. 13 is a sectional view of when another extension memory board is mounted on the memory board and on the extension memory board shown in FIG. 2B according to a further embodiment.

FIGS. 12 and 13 illustrate a modified embodiment for mounting the memory boards 2 to 4 and the memory boards 5 to 7 on the same base portion 18.

In the case of FIG. 12, the metal fitting 21' has such a shape that the metal fitting 21 shown in FIG. 11A is elongated in the vertical direction. In this embodiment, therefore, the hole 21c on the lower side of the metal fitting 21' is directly fastened by screws onto the base portion 18, and the hole 21c on the upper side is fastened by screws to the second memory board 5 via the spacer 9a in the same manner as in the embodiment of FIGS. 11A and 11B. This modified embodiment is effective when the memory boards 2 to 4 overlap one another via spacers 9 as shown in FIG. 10A.

In the case of FIG. 13, a metallic spacer 9' having screws 9b on both sides thereof is provided between the first and second extension memory boards 3, 4 and the second memory board 5. This modified embodiment is effective when the memory boards 2 to 4 and the memory boards 5 to 7 are overlapped one upon the other using spacers 9 shown in FIG. 10A. The screws 9c at both ends of the metallic spacer 9' are screwed into threaded holes 9c of the upper and lower two spacers 9, so that the second memory board 5 is mounted on the first and second extension memory boards 3 and 4. Moreover, since the spacer 9' is made of a metal, the grounding patterns of the first and second extension memory boards 3, 4 and the second memory board 5 are electrically connected together. Thus, the spacer 9' works in the same manner as the metal fittings 21, 21'.

Since a plurality of memory boards are coupled together via metal fittings or the like as described above, the memory boards 2 to 7 having the same constitution can be mounted on the same base portion 18. In particular, the metal fitting 21 and the spacer 9' are electrically conducting. In order to electrically connect the grounding patterns of the memory boards 2 to 7, the grounding patterns of the memory boards 2 to 7 are all rendered conductive to each other, in order to decrease electrostatic noise or the effects of electromagnetic waves from the outside.

It need not be pointed out that the present invention can be applied to a variety of electronic apparatuses in addition to the POS terminal equipment 30.

Figure 14:
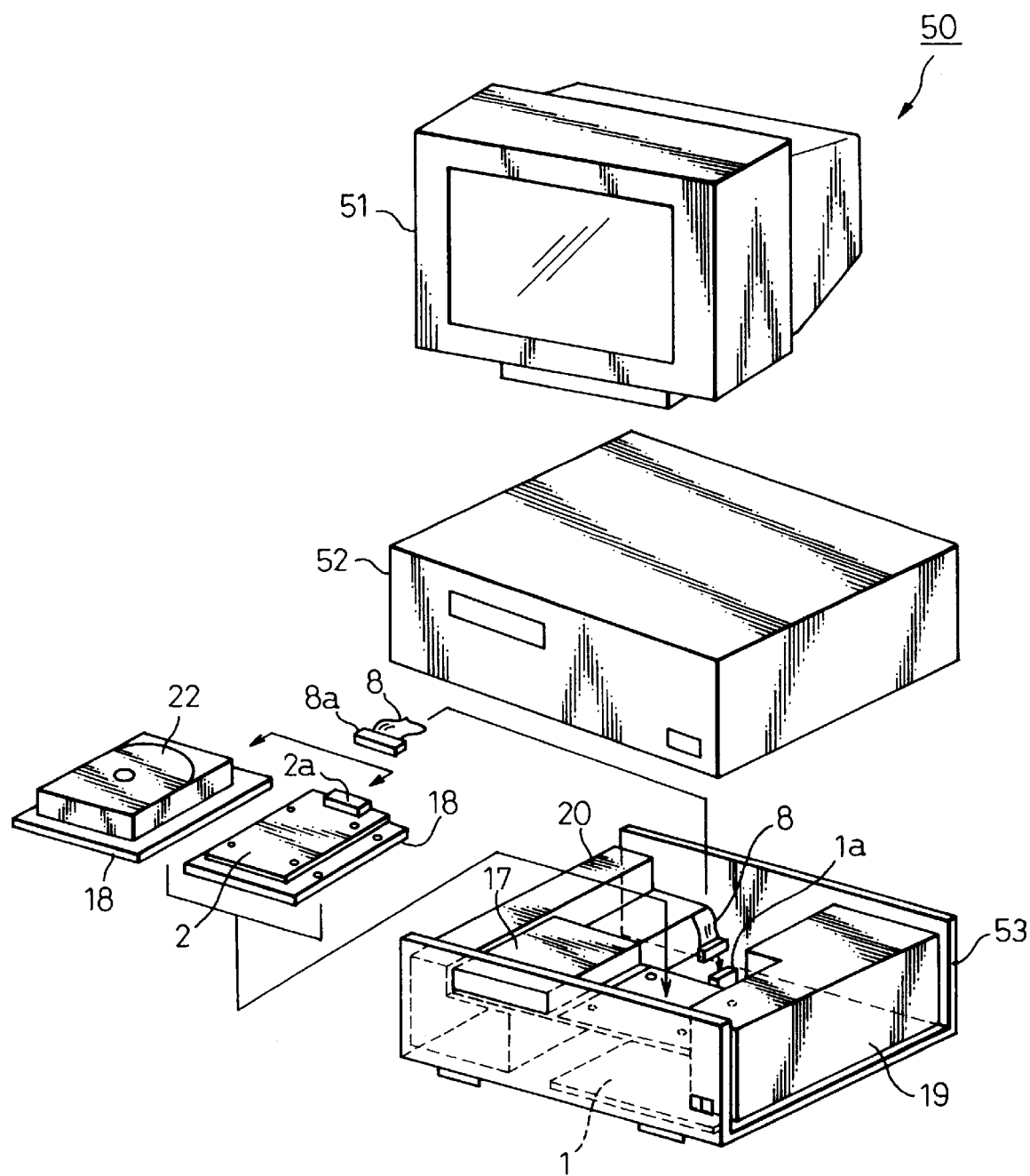
FIG. 14 is a perspective view of an assembly of a personal computer which is another electronic apparatus for which the static memory device of the present invention can be used.

FIG. 14 illustrates an example where the static memory device of the present invention is applied to a personal computer 50. To simplify the description, the same members as those of the control unit 33 of FIG. 2A are denoted by the same reference numerals.

In FIG. 14, reference numeral 51 denotes a display, 52 denotes a body cover, and 53 denotes a control unit. Like that of FIG. 2A, the control unit 53 of the personal computer 50 is provided with a mother board 1, a floppy disk drive 17, a power source circuit 19 and a control circuit 20. In the personal computer 50 of this embodiment, either the memory board 2 mounted on the base portion 18 or the hard disk drive 22 mounted on the base portion 18 can be mounted on the control unit 33. The connector 2a of the ROM board 2 or the connector (not shown) of the hard disk drive 22 is connected to the mother board 1 through the flat cable 8 that connects to the connector 1a of the mother board 1.

According to the present invention as described above, a storage device such as hard disk or the like and a semiconductor memory such as memory board or the like can be selectively mounted on the common base portion without providing a new space or a new mechanism in the electronic apparatus. Accordingly, the electronic apparatus does not become bulky and no additional mechanism must be provided to drive up the cost.

When the semiconductor memory is mounted, in particular, the outer shape and size thereof are nearly the same as those of when the hard disk or any other storage unit is mounted. Therefore, no problem in space arises even when the semiconductor memory is mounted.

Furthermore, the memory boards can be mounted as required and in a required number, making it possible to extend the storage capacity stepwisely.

The threaded holes for mounting the memory boards on the apparatus are brought into agreement with the grounding patterns of the boards, and the memory boards that are mounted are connected together through members having electrically conducting property. Therefore, the grounds of the memory boards can be electrically connected through a simple mechanism, to decrease the effects of noise.

Moreover, since the upper and lower memory boards are fastened together using spacers, it is possible to prevent the connectors connecting the memory boards from being disconnected by vibration, and the apparatus exhibits improved reliability.

What is claimed is:

1. A static memory device mounted on a base portion installed in an electronic apparatus that operates using a control unit equipped with a microcomputer and in which said static memory device may be replaced by a disk drive having threaded holes and mounted on the base portion, the base portion having attachment points corresponding to the threaded holes of the disk drive, said static memory device being coupled, via a cable, to the control unit and operating as an internal storage unit for said control unit, said static memory device comprising:

a memory board which has threaded holes which align with the attachment points of the base portion, which is mountable on the base portion, and which has a projected area smaller than the projected area of the disk drive; and a connector which is mounted on said memory board and is connected to the other end of the cable.

2. A static memory device according to claim 1, further comprising:

a connector for memory extension mounted on said memory board;

a spacer mountable on said memory board; and at least a piece of extension memory board which is connected to the connector for memory extension, is held by said spacer maintaining a predetermined gap from said memory board, and which has a projected area smaller than the projected area of said memory board.

3. A static memory device according to claim 2, wherein said spacer comprises an electrically conducting member, and wherein the ground pattern of said memory board and the ground pattern of said extension memory board are rendered to be conductive to each other by said spacer.

4. A static memory device according to claim 3, further comprising:

a joint mounted on said extension memory board;

a second memory board installed over said extension memory board via the joint and having a projected area smaller than the projected area of said memory board; and a connector mounted on the second memory board and connected to the other end of said cable.

5. A static memory device according to claim 4, wherein said joint is constituted by an electrically conducting member, and the grounding pattern of said second memory board and the grounding pattern of said extension memory board are rendered to be conductive to each other through said joint.

6. A static memory device according to claim 5, further comprising:

a connector for memory extension mounted on said second memory board;

a spacer mountable on said second memory board; and at least a piece of second extension memory board which is connected to the connector for memory extension, is held by said spacer to maintain a predetermined gap from said memory board, and has a projected area smaller than the projected area of said memory board.

7. A static memory device according to claim 6, wherein said spacer comprises an electrically conducting member, and wherein the grounding pattern of said second memory board and the grounding pattern of said second extension memory board are rendered to be conductive to each other through said spacer.

8. A static memory device according to claim 6, wherein the height of said second extension memory board on said base portion is the same as the height of said disk drive.

9. A static memory device according to claim 3, further comprising:

a joint mounted on said base portion for arranging a new memory board on said extension memory board;

a second memory board disposed on said extension memory board via the joint and having a projected area smaller than the projected area of said memory board; and a connector which is mounted on the second memory board and which is connected to the other end of said cable.

10. A static memory device according to claim 9, wherein said joint is constituted by an electrically conducting member, and wherein the grounding pattern of said second memory board and the ground pattern of said base are rendered to be conductive to each other by said joint.

11. A static memory device according to claim 10, further comprising:

a connector for memory extension mounted on said second memory board;

a spacer mountable on said second memory board; and at least a piece of second extension memory board which is connected to the connector for memory extension, is held by said spacer to maintain a predetermined gap from said memory board, and has a projected area smaller than the projected area of said memory board.

12. A static memory device according to claim 11, wherein said spacer is constituted by an electrically conducting member, and wherein the grounding pattern of said second memory board and the grounding pattern of said second extension memory board are rendered to be conductive to each other through said spacer.

13. A static memory device according to claim 11, wherein the height of said second extension memory board on said base portion is the same as the height of said disk drive.

14. A static memory device according to claim 1, wherein said electronic apparatus is a POS terminal equipment.

15. A static memory device according to claim 1, wherein said electronic apparatus is a personal computer.

\* \* \* \* \*